United States Patent [19]

Tokairin et al.

[11] Patent Number: 5,667,351
[45] Date of Patent: Sep. 16, 1997

[54] POSITIONING AND CLAMPING DEVICE OF A BOARD

[75] Inventors: Takeshi Tokairin; Tatsuyuki Ishijima, both of Tokyo, Japan

[73] Assignee: Seikosha Co., Ltd., Tokyo, Japan

[21] Appl. No.: 462,731

[22] Filed: Jun. 5, 1995

[30] Foreign Application Priority Data

Jun. 6, 1994 [JP] Japan ................... 6-124068

[51] Int. Cl.⁶ ..................................... H05K 3/00
[52] U.S. Cl. ................ 414/225; 414/753; 414/783; 198/379
[58] Field of Search ................ 414/751, 753, 414/225, 783, 780; 198/379

[56] References Cited

U.S. PATENT DOCUMENTS

| | | | |
|---|---|---|---|
| 4,217,068 | 8/1980 | Fossard | 414/753 |
| 4,284,382 | 8/1981 | Silverman | 414/753 |
| 4,297,927 | 11/1981 | Kuroda | 414/753 |
| 4,774,759 | 10/1988 | Makoto et al. | |
| 5,400,652 | 3/1995 | Haar | 414/751 |

FOREIGN PATENT DOCUMENTS

| | | |
|---|---|---|
| 0254030 | 1/1988 | European Pat. Off. . |
| 2622383 | 4/1989 | France . |
| 57-85285 | 5/1982 | Japan . |
| 63-31959A | 7/1988 | Japan . |
| 7328974 | 12/1995 | Japan . |
| 2158419 | 11/1985 | United Kingdom . |

*Primary Examiner*—Karen B. Merritt
*Assistant Examiner*—Gregory A. Morse
*Attorney, Agent, or Firm*—Jordan and Hamburg

[57] ABSTRACT

A device for positioning and clamping a board includes a plurality of clamping devices for clamping an edge portion of the board. Each clamping device includes positioning members for positioning the board with respect thereto, and a dragging device disposed between the clamping devices for dragging the board into contact with the positioning members. The dragging device is provided with a board clamping portion including a lower claw and an upper claw having rotating disks rotatably installed thereon for swivably clamping the board, and a reciprocating mechanism connected with the board clamping portion for reciprocating the board clamping portion. A board is first clamped by the dragging device and is dragged into contact with the positioning members of the clamping devices. The board is then pivoted and its attitude is straightened by further movement against the positioning members of the clamping devices, then the board is firmly clamped by the clamping devices and the clamping by the dragging device is released. Finally, the clamping devices are moved and a standard location is determined at a portion where the board traverses a sensor, thereby improving the space efficiency and avoiding lowering of positioning accuracy due to scattering of cutting chips.

13 Claims, 6 Drawing Sheets

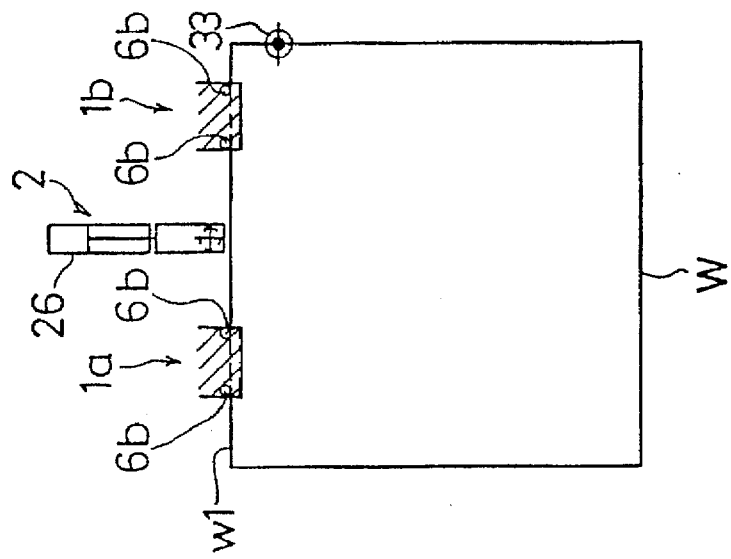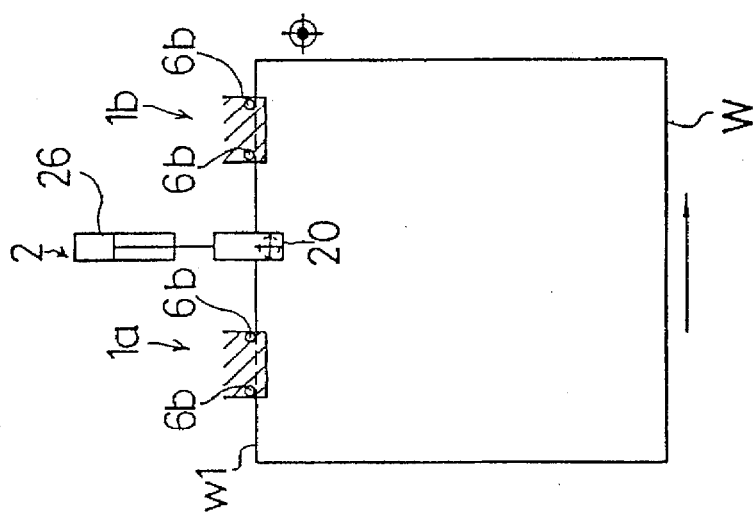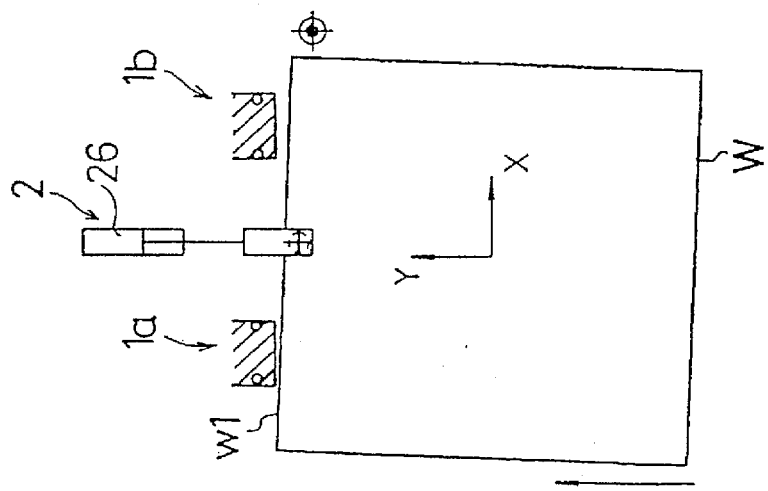

POSITIONING AND CLAMPING DEVICE OF A BOARD

BACKGROUND OF THE INVENTION

The present invention relates to a device for positioning a printed circuit board prior to processing the same in a perforating operation at a predetermined location and clamping the printed circuit board in a normal attitude.

In a conventional perforating device of a printed circuit board, unprocessed circuit boards are stacked in a stock box of a stock means. The topmost circuit board is then picked-up by a chuck of a carrier means and transferred to a positioning means. However, the position of the printed circuit board fed by the positioning means is not accurate, but rather, is at an approximate location. Therefore, after accurately positioning the board by the positioning means in conformity with a predetermined standard location, the board is transferred to a perforating means while being in the positioned state and predetermined portions of the printed circuit board are perforated by drills of a perforating means.

In a first example of a conventional positioning means, as disclosed in Japanese Patent Laid-Open No. 85285/1982, there are provided two pivotally fixed rollers opposing a first side of a square circuit board and a further pivotally fixed roller opposing a second side which is orthogonal to the first side. Pivotally movable rollers push the circuit board into contact with the respective fixed rollers so as to push the printed circuit board in the X and Y directions to thereby position the printed circuit board at a standard location.

In a second example of a conventional positioning means, as disclosed in Japanese Patent Laid-Open No. 31959/1988, fixing side positioning members are provided in a vertically movable manner, such that two contiguous sides of a printed circuit board can respectively contact the same. In order to bring the two sides of the printed circuit board into contact with the respective fixing side positioning members, a transverse direction positioning device and a longitudinal direction positioning device are provided at locations proximate the two remaining sides of the printed circuit board, and rollers are respectively provided on both of the transverse and longitudinal direction positioning devices. When the printed circuit board is fed on a table, the printed circuit board is moved such that the rollers of the longitudinal and transverse direction positioning devices are guided by guide grooves. Thus, the printed circuit board is moved in the direction of the positioning members on the fixing side, and two sides of the circuit board are brought into contact with the fixing side positioning members, thereby positioning the printed circuit board at a reference location.

However, in both the first and the second conventional examples, fixing side or moving side positioning means (pins or rollers) are installed at an outer periphery of the four sides of the transverse square printed circuit board. Therefore, the space for installation is increased. This results in an inefficient use of space. Further, the location of the positioning means on the moving side must be moved to be adjusted in conformity with various sizes of the printed circuit board which further results in an inefficient use of the space. Still further, cutting chips are scattered in the perforating operation, and if there are guide grooves as in the second conventional example, the chips are piled up in the guide grooves, thereby lowering the accuracy of positioning. In addition, it is necessary to retract the positioning means such that is does not create a hindrance in feeding the board, and normally, the positioning means has a structure in which pins and the like escape to a lower portion of the table. In other words, pins and the like are provided at the lower portion of the table such that they protrude above the table in the positioning operation. Therefore, it is naturally necessary to provide guide grooves having the shape of an elongated opening to make them movable.

SUMMARY OF THE INVENTION

It is an object of the present invention to provide a positioning and clamping device for positioning a printed circuit board at a proper location.

It is another object of the present invention to provide a positioning and clamping device for a printed circuit board, having an improved space efficiency.

According to an aspect of the present invention, a positioning and clamping device for a printed circuit board includes a plurality of clamping means disposed along a side of the board for clamping an edge portion of the board and a dragging means disposed between the plurality of clamping means for dragging the board. The clamping means is provided with positioning members, while the dragging means comprises a board clamping portion which pivotally clamps the board and a reciprocating means for reciprocating the board clamping portion.

The above and other objects, features and advantages of the invention will become readily apparent from the following detailed description thereof which is to be read in connection with the accompanying drawings.

BRIEF DESCRIPTION OF THE DRAWINGS

An explanation will be given of embodiments of the present invention with reference to drawings as follows.

FIGS. 6(a), 6(b) and 6(c) are top plan schematic views for explaining respective steps of the operation of positioning and clamping.

DESCRIPTION OF THE PREFERRED EMBODIMENTS

Figure 5:
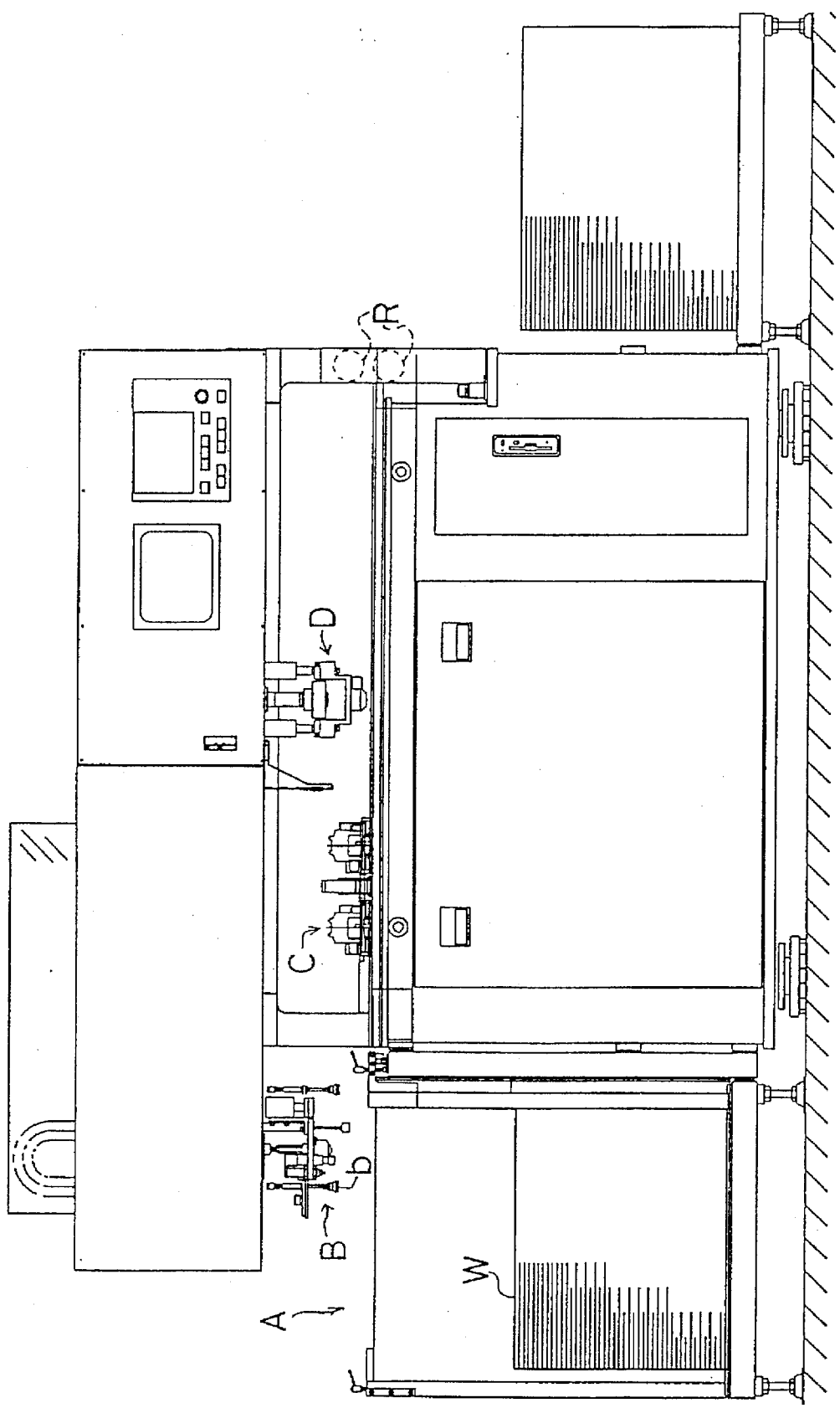
FIG. 5 is a front elevational view showing an entire processing device adopting the above embodiment.

Referring first to FIG. 5, in a device for perforating printed circuit boards, unprocessed printed circuit boards W are stacked in a stock box of a stock means A. The topmost board W of the stack is picked up by a suction chuck b of a carrier means B and fed to a positioning and clamping device (clamper) C. The board W is positioned at a predetermined standard location by the positioning and clamping device C and is transferred to a perforating device D while being clamped. Predetermined portions of the printed circuit board W are then perforated by drills of the perforating device D and thereafter discharged to the outside by discharge rollers R.

The positioning and clamping device C according to the present invention includes a plurality of clamping means arranged along a side of a printed circuit board for clamping an edge portion of the printed circuit board and a dragging means arranged between the clamping means for dragging the printed circuit board. An explanation will now be given of respective specific structures of the clamping means and the dragging means.

Figure 1:
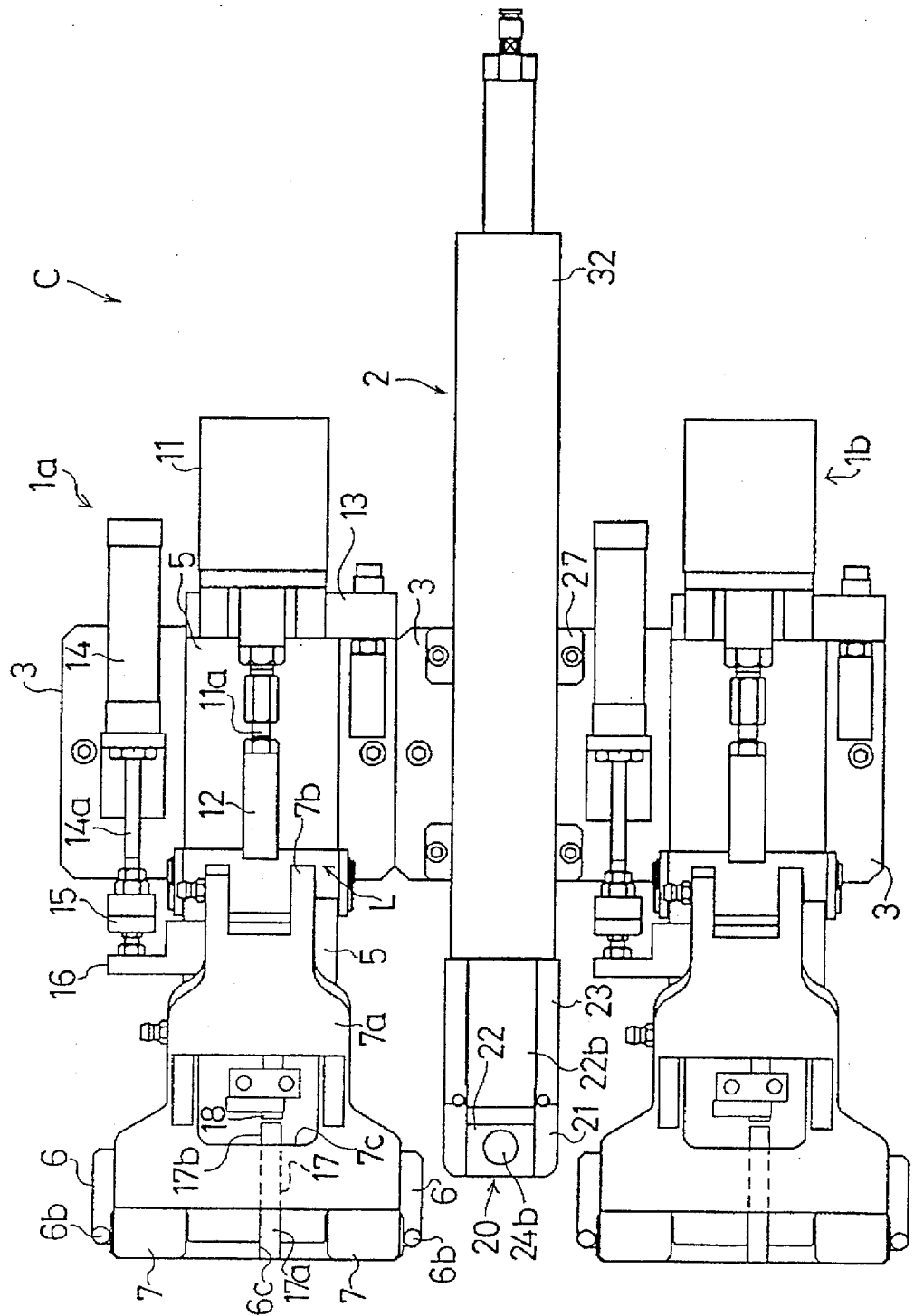
FIG. 1 is a top plan view of a positioning and clamping device according to one embodiment of the present invention.

As shown in FIG. 1, in the positioning and clamping device C, a plurality of clamping means 1a and 1b are installed along a side w1 of the printed circuit board W and a dragging means 2 is installed between the plurality of the clamping means. Although the use of two clamping means 1a and 1b is a preferred embodiment, the present invention is not limited to this number of clamping means. The clamping means 1a and 1b and dragging means 2 are all provided on a mounting base 3. Mounting base 3, in turn, is mounted on an XY table device 4, as shown in FIG. 2, which is movable in both the X and Y directions, although a detailed explanation of such movement will not be given herein.

Clamping means 1a constitutes a left claw while clamping means 1b constitutes a right claw. However, both clamping means 1a and 1b have the same structure and therefore, a detailed explanation of the structure thereof will be given as to a general clamping means 1 (FIG. 2).

Figure 2:
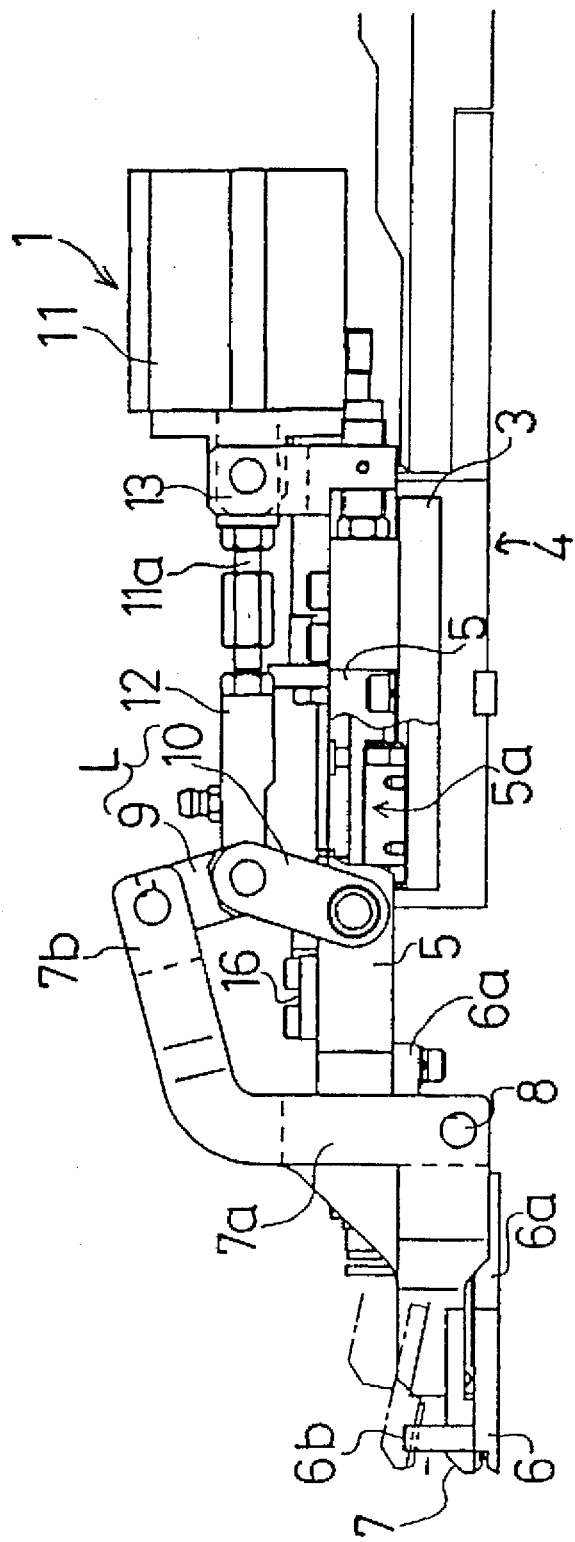
FIG. 2 is an elevational view of the front of a clamping means of the positioning and clamping device.
Figure 3:
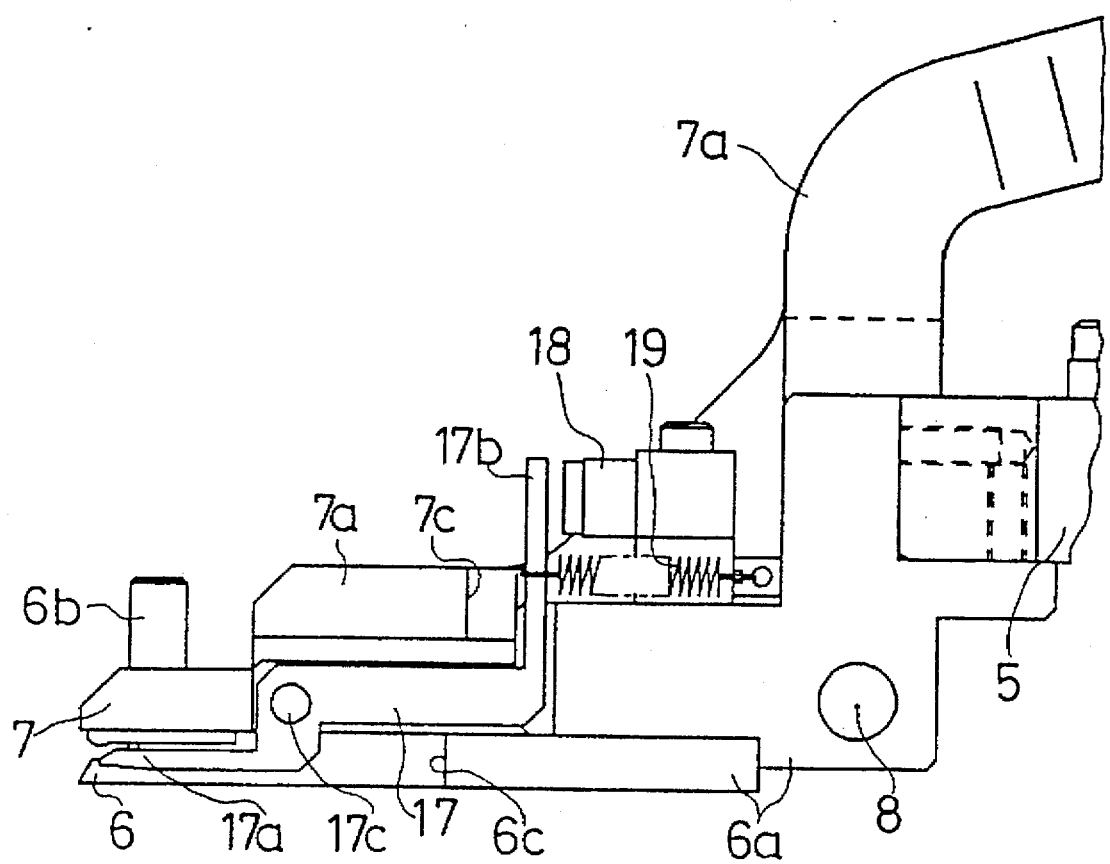
FIG. 3 is an enlarged cross-sectional view of a front end portion of the clamping means.

As shown in FIG. 1 through FIG. 3, clamping means 1 includes a fixed lower claw 6 and an upper claw 7 which overlaps lower claw 6 in such a manner that printed circuit board W can be pinched between both claws 6 and 7. A mounting plate 5 which is forwardly and rearwardly slidable, that is, to the left and right in FIG. 2, along linear guides 5a is mounted on the upper face of mounting base 3 and a lower claw mounting member 6a to which lower claw 6 is fixed, is fixed on the lower face of a front end portion (left end portion in FIG. 2) of mounting plate 5. An upper claw mounting member 7a to which upper claw 7 is fixed is pivotably connected to lower claw mounting member 6a via a connecting pin 8. Positioning pins 6b protrude from lower claw 6 and a position of an end face of a side of printed circuit board W is regulated by positioning pins 6b.

A rear end portion 7b of upper claw mounting member 7a is connected to mounting plate 5 via a linkage mechanism L. Upper claw 7 is opened and closed with respect to the lower claw 6 by converting a linear motion of a rod 11a of a cylinder 11 into a pivotal motion of upper claw mounting member 7a via a connecting member 12 that is fixed to linkage mechanism L. In other words, connecting member 12 is reciprocated by the action of rod 11a of cylinder 11. As a result, links or arms 9 and 10 connected therewith, are pivoted via a connecting pin, whereby upper claw mounting member 7a is pivoted in correspondence therewith. Cylinder 11 is mounted to a mounting plate 13 which is fixed to mounting plate 5 in a slightly pivotal fashion in the vertical direction.

The standard location of printed circuit board W, which is regulated by positioning pins 6b provided on lower claw 6, is adjusted by reciprocating a cylinder rod 14a of a cylinder 14 fixed to mounting base 3. Specifically, movement of the front end portion of cylinder rod 14a is transferred to support plate 5 via a shock absorber 15 fixed to a connecting plate 16 that is fixed to mounting plate 5. Thus, mounting plate 5 is controlled in its movement along linear guides 5a. It will therefore be appreciated that the total movement of clamping means 1 is controlled by the forward and backward movements of support plate 5 along linear guides 5a, and that locations of positioning pins 6b are adjusted to proper locations by moving them forwardly and backwardly therewith.

As shown in FIG. 3, a device for detecting whether printed circuit board W is clamped or not is provided between upper claw 7 and lower claw 6. In this detecting device, a groove 6c is provided at the central portion of lower claw 6, and a detecting lever 17 disposed in the groove is pivotably supported by a connecting pin 17c. A front end portion 17a of detecting lever 17 is disposed a little rearward from the front end of lower claw 6 and a rear end portion 17b is bent upwardly and protrudes from an opening 7c provided on upper claw mounting member 7a. An access sensor 18 is positioned at the rear of rear end portion 17b, and the rear end portion 17b is urged rearwardly by a spring 19. Therefore, rear end portion 17b is proximate to access sensor 18 when printed circuit board W is not present, thereby detecting the absence of a printed circuit board W. When a printed circuit board W is present, detecting lever 17 is pivoted in the counter-clockwise direction of FIG. 3, so that rear end portion 17b is no longer proximate to access sensor 18.

Figure 4:
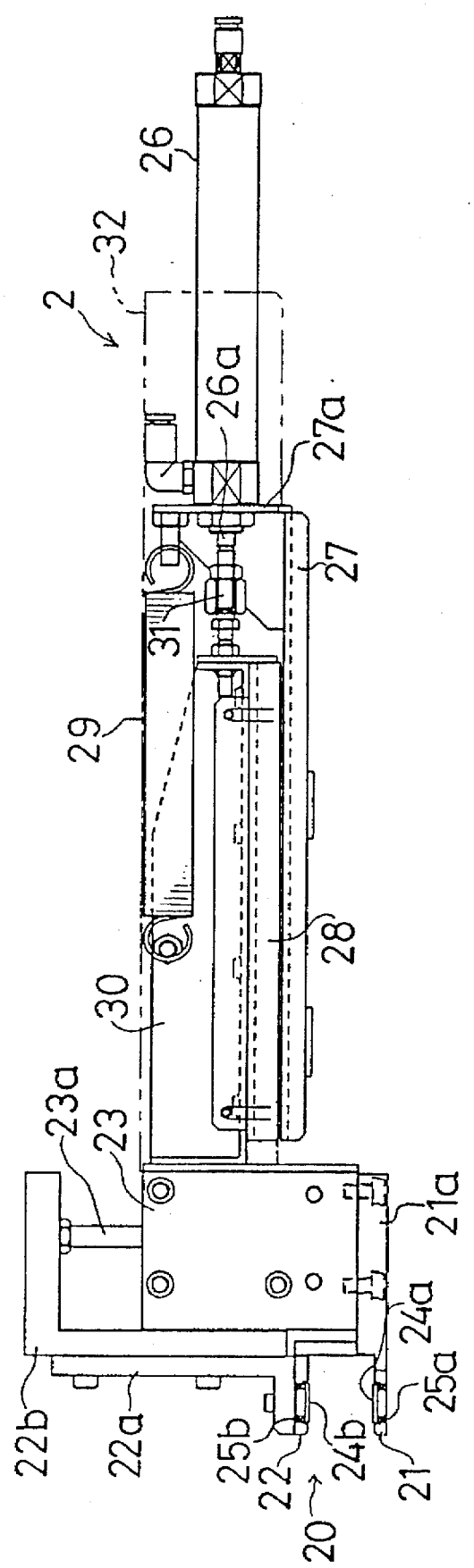
FIG. 4 is an elevational view of a dragging means of the positioning and clamping device.

Next, an explanation will be given of dragging means 2. As shown in FIG. 4, dragging means 2 includes a board clamping portion 20 comprising a fixed lower claw (one claw portion) 21 and an upper claw (other claw portion) 22 which is movable toward and away from lower claw 21. An open-close cylinder 23 is connected between claws 21 and 22 and is provided as a means of driving claw portions 21 and 22 apart and together to open and closed positions, respectively.

Specifically, lower claw 21 is provided on the lower face of open-close cylinder 23 via a lower claw mounting member 21a, while upper claw 22 is fixed to an upper claw mounting member 22a which in turn is fixed to an upper claw guide member 22b connected to the free end of a cylinder rod 23a of open-close cylinder 23. Board clamping portion 20 has a structure of pivotally pinching the printed circuit board, and the lower claw 21 and the upper claw 22 are provided with mutually opposing rotating disks or plates 24a and 24b that are rotatable by bearings 25a and 25b.

Further, a reciprocating cylinder 26 is installed as a means of reciprocating board clamping portion 20. Reciprocating cylinder 26 is supported by a support plate portion 27a of a base 27 fixed to mounting base 3. A linear slide table 28 is reciprocally provided on base 27. A slider 30 which is fixed to slide table 28, is dragged rearwardly by a spring 29 which has a rear end thereof hooked to support plate portion 27a. The retracted location of slider 30 corresponds to the retracted location of board clamping portion 20 which must be adjusted such that it is retractable rearward from positioning pins 6b of clamping means 1a and 1b. The retracted location is determined by making the rear end of an adjusting screw 31 contact the front end of cylinder rod 26a of reciprocating cylinder 26. Open-close cylinder 23 of board clamping portion 20 is fixed to the front end of slider 30. Further, slider 30, spring 29 and the like are covered with a cover 32.

An explanation will now be given of the operation of this embodiment. The unprocessed printed circuit board W which has been picked-up by suction chuck b of carrier means B shown in FIG. 5 and fed to positioning and clamping device C, is at first dragged by dragging means 2, as shown in the simplified drawing of FIG. 6(a). Specifically, upper claw 22 of board clamping portion 20 is made to rise by extending cylinder rod 23a of open-close cylinder 23, and at the same time, cylinder rod 26a of reciprocating cylinder 26 is moved forwardly. As a result of the latter movement, slide table 28 and slider 30 are moved forwardly against the force of spring 29 to a location at which printed circuit board W can be pinched. Then, upper claw 22 is lowered by retracting cylinder rod 23a and the edge portion of side w1 of printed circuit board W is pinched or clamped between lower claw 21 and upper claw 22. Printed circuit board W is thereby brought into contact with rotating plates 24a and 24b such that printed circuit board W is clamped pivotally or in a swivel manner at an arbitrary angle. When printed circuit board W is in a slanted state as shown in FIG. 6(a), and cylinder rod 26a of reciprocating cylinder 26 is retracted while clamping printed circuit board W, whereby slide table 28 and slider 30 are retracted by the spring force of spring 29 and printed circuit board W is dragged.

On the other hand, in clamping means 1a and 1b, when cylinders 11 thereof are driven such that cylinder rods 11a thereof are retracted, an angle made by links 9 and 10 is decreased by linkage mechanisms L. Therefore, upper claw mounting members 7a are pivoted in the clockwise direction of FIG. 2, with connecting pins 8 as the center of pivoting, and therefore, upper claws 7 are at a location shown by chain lines of FIG. 2, that, is separated from lower claws 6. At this instance, printed circuit board W does not reach the detecting arms 17, and therefore, rear end portions 17b thereof are proximate to access sensors 18 by the action of springs 19. As a result, the absence of printed circuit board W is detected by sensors 18.

In this state, printed circuit board W is dragged by dragging means 2, as mentioned above, and the end face of side w1 of printed circuit board W is brought into contact with positioning pins 6b of clamping means 1a. Upon continued dragging by the further action of the spring force of spring 29, printed circuit board W is rotated by the presence of rotating plates 24a and 24b into the state of FIG. 6(b) in which printed circuit board W is also brought into contact with positioning pins 6b of clamping means 1b.

Printed circuit board W is thereby positioned on front end portions 17a of detecting arms 17 of both clamping means 1a and 1b, whereby detecting levers 17 are pivoted in the counter-clockwise direction, centering on connecting pins 17c, against the spring force of springs 19 by the load of printed circuit board W. In this manner, the arrival of printed circuit board W at the predetermined location is detected, and at this moment, cylinders 11 are driven. Thus, when cylinder rods 11a are moved forwardly, the angle made by links 9 and 10 is increased. Therefore, upper claw mounting members 7a are pivoted in the counter-clockwise direction, with connecting pins 8 as the centers of pivoting, by which printed circuit board W is firmly clamped between upper claws 7 and lower claws 6.

Finally, upper claw 22 is raised by driving open-close cylinder 23 of driving means 2, by which the clamping of printed circuit board W is released and cylinder rod 26a is retracted. Thus, slider 30 is retracted to the predetermined retracted location by the action of spring 29, thereby detaching from printed circuit board W into the state shown in FIG. 6(c). In this manner, printed circuit board W conforms to the standard location in the Y direction by positioning pins 6b.

Next, positioning in the X direction is performed. A detecting means such as a reflex type optical sensor 33 is arranged in the midst of the transferring route of printed circuit board W to perforating device D by clamping means 1a and 1b. As shown in FIG. 6(c), when the end face of a side of printed circuit board W reaches the location of the sensor 33, an output is caused in the sensor 33. The location of detecting this output is determined as the standard location. Therefore, printed circuit board W can accurately be transferred to a predetermined processing position by moving clamping means 1a and 1b by a transfer distance from the standard location as the start point to predetermined perforating device D.

As stated above, according to the present invention, a plurality of clamping means for clamping an edge portion of a printed circuit board are arranged along a side of the board and a dragging means of the printed circuit board is arranged between the plurality of clamping means. Therefore, members for positioning and clamping are arranged at portions along one side of the printed circuit board and portions along the other sides are open by which the space can effectively be utilized for processing. Further, it is not necessary to provide guide grooves as in conventional devices, and therefore, there is no concern of lowering the positioning accuracy caused by scattering cutting chips in the perforating operation.

Having described a specific preferred embodiment of the invention with reference to the accompanying drawings, it will be appreciated that the present invention is not limited to that precise embodiment and that various changes and modifications can be effected therein by one of ordinary skill in the art without departing from the scope or spirit of the invention as defined by the appended claims.

What is claimed is:

1. A device for positioning and clamping a board, comprising:
    a plurality of clamping means for clamping an edge portion of the board, each said clamping means including:
        a pair of claws,
        at least one positioning member for positioning the board with respect thereto and fixed relative to at least one said claw,
        linkage means connected with at least one said claw for moving at least one said claw toward the other said claw so as to clamp the board therebetween and away from the other said claw so as to release clamping of the board, and
        drive means connected with said linkage means for controlling movement of said linkage means; and
    dragging means disposed between the plurality of clamping means for dragging the board into contact with said at least one positioning member, the dragging means including:
        a board clamping portion for clamping the board, the board clamping portion including:
            a pair of claw portions respectively provided with rotatable members at mutually opposed locations thereof such that the rotatable members are adapted to contact opposite surfaces of the board and clamp the board therebetween in a swivel manner, and
            an open-close driving means for closing and opening the pair of claw portions to move said claw portions toward and away from each other, and
        reciprocating means for reciprocating the board clamping portion.

2. The device according to claim 1, further comprising detecting means positioned between said claws for detecting the presence and absence of the board between said claws.

3. The device according to claim 2, wherein said detecting means includes:
    a sensor fixed relative to a base,
    a pivotally movable L-shaped detecting lever having one leg positioned between said claws and another leg positioned adjacent said sensor, and
    spring means connected between said base and said detecting lever for biasing said detecting lever such that said other leg thereof is positioned adjacent said sensor, wherein said sensor detects the absence of the board between said claws, and wherein when the board is positioned between said claws, the board moves the detecting lever in a direction against a force of said spring means such that said sensor detects the presence of the board between the claws.

4. The device according to claim 1, wherein the open-close driving means includes a cylinder having a movable rod, with one claw portion being fixed to said cylinder and the other claw portion being fixed to said rod.

5. The device according to claim 1, wherein said reciprocating means includes:
 a slider slidably mounted on a base, said slider being fixed to said open-close driving means,
 spring means secured between said base and said slider for normally biasing said slider in a direction away from the board, and
 a reciprocating cylinder having a movable rod engageable with said slider for moving said slider in a direction toward the board and against a force of said spring means.

6. The device according to claim 1, wherein one said claw is fixed on a base, and the other said claw is pivotally connected relative to said one claw, with said linkage means being connected with said other claw for pivotally moving said other claw toward and away from said one claw, and said drive means includes a cylinder having a movable rod connected with said linkage means.

7. A device for positioning and clamping a board comprising:
 a plurality of clamping means for clamping an edge portion of the board, each said clamping means including at least one positioning member for positioning the board with respect thereto;
 dragging means disposed between the plurality of clamping means for dragging the board into contact with said at least one positioning member, the dragging means including:
  a board clamping portion for clamping the board, and reciprocating means connected with the board clamping portion for reciprocating the board clamping portion;
 said board clamping portion including:
  a pair of claw portions respectively provided with rotatable members at mutually opposed locations thereof such that the rotatable members are adapted to contact opposite surfaces of the board and clamp the board therebetween in a swivel manner, and
  an open-close driving means for closing and opening the pair of claw portions to move said claw portions toward and away from each other.

8. The device according to claim 1, wherein said reciprocating means includes:
 a slider slidably mounted on a base, said slider being fixed to said open-close driving means,
 spring means secured between said base and said slider for normally biasing said slider in a direction away from the board, and
 a reciprocating cylinder having a movable rod engageable with said slider for moving said slider in a direction toward the board and against a force of said spring means.

9. The device according to claim 8, wherein said reciprocating means further includes adjustment means on one of said slider and said movable rod for limiting movement of said slider in said direction away from the board.

10. The device according to claim 1, wherein the open-close driving means includes a cylinder having a movable rod, with one claw portion being fixed to said cylinder and the other claw portion being fixed to said rod.

11. A device for positioning and clamping a board, comprising:
 a plurality of clamping means for clamping an edge portion of the board, each said clamping means including:
  a pair of claws, one said claw being fixed on a first base, and the other said claw being pivotally connected relative to said one claw,
  at least one positioning member for positioning the board with respect thereto and fixed relative to said one claw,
  linkage means connected with said other claw for pivotally moving said other claw toward said one claw so as to clamp the board therebetween and away from said one claw so as to release clamping of the board, and
  drive means connected with said linkage means for controlling movement of said linkage means, said drive means including a cylinder having a movable rod connected with said linkage means;
 dragging means disposed between the plurality of clamping means for dragging the board into contact with said at least one positioning member, the dragging means including:
  a board clamping portion for clamping the board, the board clamping portion including:
   a pair of claw portions respectively provided with rotatable members at mutually opposed locations thereof such that the rotatable members are adapted to contact opposite surfaces of the board and clamp the board therebetween in a swivel manner, and
   an open-close driving means for closing and opening the pair of claw portions to move said claw portions toward and away from each other, the open-close driving means including a cylinder having a movable rod, with one claw portion being fixed to said cylinder and the other claw portion being fixed to said rod, and
  reciprocating means for reciprocating the board clamping portion, said reciprocating means including:
   a slider slidably mounted on a second base, said slider being fixed to said open-close driving means,
   spring means secured between said second base and said slider for normally biasing said slider in a direction away from the board, and
   a reciprocating cylinder having a movable rod engageable with said slider for moving said slider in a direction toward the board and against a force of said spring means; and
 detecting means positioned between said claws for detecting the presence and absence of the board between said claws, said detecting means including:
  a sensor fixed relative to a base,
  a pivotally movable L-shaped detecting lever having one leg positioned between said claws and another leg positioned adjacent said sensor, and
  spring means connected between said base and said detecting lever for biasing said detecting lever such that said other leg thereof is positioned adjacent said sensor, wherein said sensor detects the absence of the board between said claws, and wherein when the board is positioned between said claws, the board moves the detecting lever in a direction against a force of said spring means such that said sensor detects the presence of the board between the claws.

12. A device for positioning and clamping a board comprising:

a plurality of clamping means for clamping an edge portion of the board, each said clamping means including at least one positioning member for positioning the board with respect thereto;

dragging means disposed between the plurality of clamping means for dragging the board into contact with said at least one positioning member, the dragging means including:

a board clamping portion for clamping the boards, and reciprocating means connected with the board clamping portion for reciprocating the board clamping portion;

each of said clamping means including:

a pair of claws, linkage means connected with at least one said claw for moving at least one said claw toward the other said claw so as to clamp the board therebetween and away from the other said claw so as to release clamping of the board, and drive means connected with said linkage means for controlling movement of said linkage means;

detecting means positioned between said claws for detecting the presence and absence of the board between said claws, said detecting means including:

a sensor fixed relative to a base, a pivotally moveable L-shaped detecting lever having one leg positioned between said claws and another leg positioned adjacent said sensor, and spring means connected between said base and said detecting lever for biasing said detecting lever such that said other leg thereof is positioned adjacent said sensor wherein said sensor detects the absence of the board between said claws, and wherein when the board is positioned between said claws, the board moves the detecting lever in a direction against a force of said spring means such that said sensor detects the presence of the board between the claws.

13. A device for positioning and clamping a board comprising:

a plurality of clamping means for clamping an edge portion of the board, each said clamping means including at least one positioning member for positioning the board with respect thereto;

dragging means disposed between the plurality of clamping means for dragging the board into contact with said at least one positioning member, the dragging means including:

a board clamping portion for clamping the board, and reciprocating means connected with the board clamping portion for reciprocating the board clamping portion;

detecting means positioned adjacent said clamping means for detecting the presence and absence of the board against said at least one positioning member, said detecting means including:

a sensor fixed relative to a base, a pivotally movable L-shaped detecting lever having one leg positioned within said clamping means and another leg positioned adjacent said sensor, and spring means connected between said base and said detecting lever for biasing said detecting lever such that said other leg thereof is positioned adjacent said sensor wherein said sensor detects the absence of the board within said clamping means, and wherein when the board is positioned within said clamping means, the board moves the detecting lever in a direction against a force of said spring means such that said sensor detects the presence of the board within said clamping means.

* * * * *